United States Patent
Brinkis et al.

(10) Patent No.: US 7,453,145 B2
(45) Date of Patent: Nov. 18, 2008

(54) ELECTRONICS UNIT

(75) Inventors: Waldemar Brinkis, Nidderau (DE);
Erich Mattmann, Heidesheim (DE);
Bernd Thyzel, Schlossborn (DE); Klaus Weber, Kronberg (DE)

(73) Assignee: Siemens Aktiengesellschaft, München (DE)

( * ) Notice: Subject to any disclaimer, the term of this patent is extended or adjusted under 35 U.S.C. 154(b) by 743 days.

(21) Appl. No.: 10/615,134

(22) Filed: Jul. 8, 2003

(65) Prior Publication Data
US 2005/0254220 A1   Nov. 17, 2005

(30) Foreign Application Priority Data
Jul. 8, 2002   (DE) ................ 102 30 712

(51) Int. Cl.
*H01L 23/34* (2006.01)
(52) U.S. Cl. .......... 257/717; 257/709; 257/713; 257/731; 257/E27.113; 361/697; 361/718; 361/793
(58) Field of Classification Search .......... 257/709, 257/713, 717, 731, E27.113; 361/697, 718, 361/793
See application file for complete search history.

(56) References Cited

U.S. PATENT DOCUMENTS

| | | | | |
|---|---|---|---|---|
| 3,714,709 A | * | 2/1973 | Liederbach | 29/841 |
| 4,521,476 A | * | 6/1985 | Asai et al. | 428/209 |
| 4,724,040 A | * | 2/1988 | Iwasa | 216/16 |
| 5,016,089 A | * | 5/1991 | Fujii et al. | 257/750 |
| 5,104,707 A | | 4/1992 | Watanabe et al. | |
| 5,245,510 A | * | 9/1993 | Honda | 361/718 |
| 5,785,879 A | | 7/1998 | Kawamura et al. | |
| 5,917,403 A | * | 6/1999 | Hashimoto et al. | 338/307 |
| 6,417,027 B1 | * | 7/2002 | Akram | 438/109 |
| 2002/0008967 A1 | | 1/2002 | Feustel et al. | |

FOREIGN PATENT DOCUMENTS

EP   1249869 A2 * 10/2002
GB   1 210 175      10/1970

OTHER PUBLICATIONS

Oba, T. et al. Sintering behavior of silver with various glass frits Published in: Electronic Manufacturing Technology Symposium 1995, Proceeding of 1995 Japan International, 18th IEEE/CPMT International 5 pages Dec. 4-6, 1995.

Ha, L. et al Thermal Study of additive multilayer circuitry on polymer and metal substrates Published in: Management Symposium, 198. SEMI-THERM Proceeding 1998., Fourteenth Annual IEEE 8 pages Mar. 10-12, 1998.

* cited by examiner

*Primary Examiner*—Sue A. Purvis
*Assistant Examiner*—Eduardo A Rodela
(74) *Attorney, Agent, or Firm*—Cohen Pontani Lieberman & Pavane LLP

(57) ABSTRACT

An electronics unit includes a low multi-point metallic mount on which an insulating layer is arranged. A conductor track system is arranged on the insulating layer and electronic power components are arranged on the conductor track system. The insulating layer is a sintered electrically insulating polymer layer on which the conductor track system, which comprises a sintered glass frit with a noble metal filling, is arranged.

12 Claims, 1 Drawing Sheet

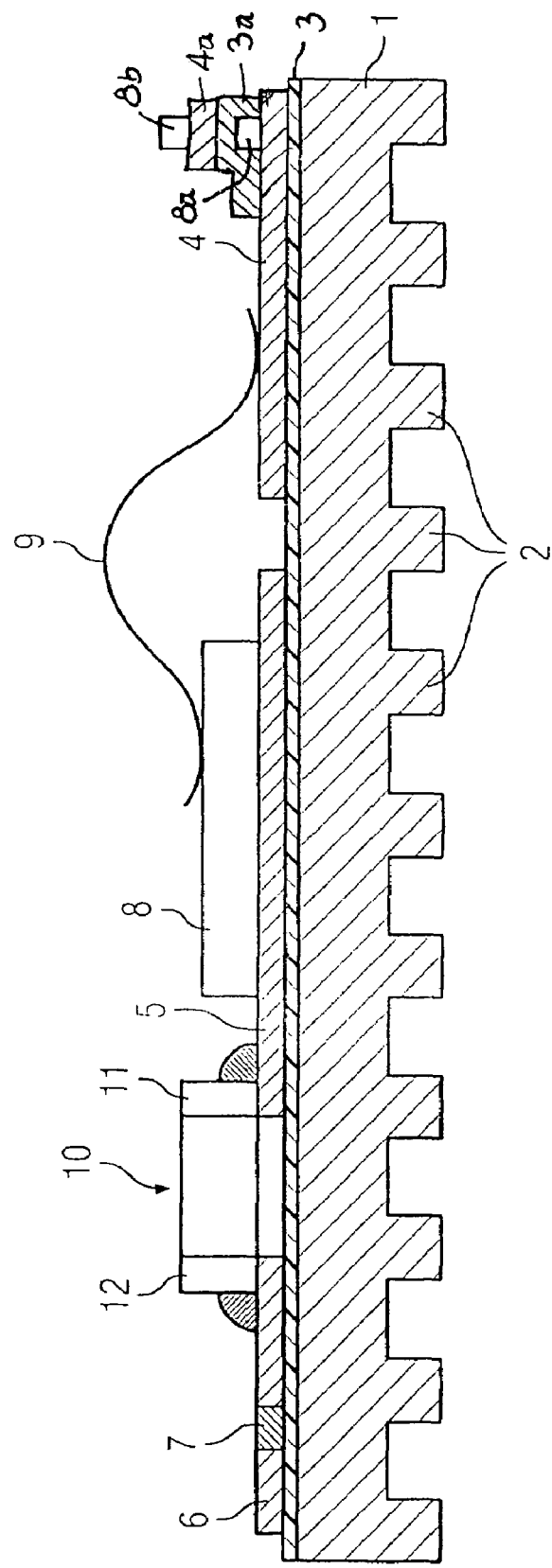

ELECTRONICS UNIT

BACKGROUND OF THE INVENTION

1. Field of the Invention

The present invention relates to an electronics unit having a low multi-point metallic mount on which an insulating layer is arranged with a conductor track system arranged on the insulating layer and electronic power components arranged on the conductor track system.

2. Description of the Related Art

In electronic units such as these, the conductor track system may be thermally linked to the mount, which is used as a heat sink. The link between the conductor track and the mount may be a heat transmission medium such as thermally conductive paste or a thermally conductive adhesive. Both the heat transfer in the heat transmission medium and the heat transfer in the mount must be taken into account for dissipation of the heat that is produced by the power components. Since the heat transmission media make up the majority of the thermal resistance of the electronics unit, the heat dissipation which can be achieved is restricted by these components and is largely inadequate for precision electronics.

SUMMARY OF THE INVENTION

The object of the invention is thus to provide an electronics unit and a method for producing an electronics unit, which electronics unit allows good heat dissipation of the heat that is produced by the power components, with a simple design and which is easily producible.

The object is achieved by an embodiment of an electronics unit with an insulating layer that is a sintered electrically insulating polymer layer on which the conductor track system, which comprises a sintered glass frit with a noble metal filling, is arranged.

The above-described embodiment produces a heat transfer from the power components to the mount and from the mount to the environment that is sufficient to ensure that the heat which is produced by the power components is dissipated as required for precision electronics.

The polymer layer and the conductor track system may be arranged without any problems not only on planar surfaces but also on three-dimensional surfaces of the mount. The polymer layer and the conductor track system may be passed over various planes such as inclines and rounded areas and, in a corresponding manner, the power components may also be placed at widely differing points on the mount.

The layers in this layer system may be applied to the mount either directly or in a transfer process, with a small number of operations.

There is no need for any pretreatments such as, for example, chemical pretreatment, whatsoever to the mount surface.

In a preferred embodiment, the noble metal filling to be a silver filling or a filling containing silver.

If the glass frit is a low melting-point glass frit, in particular with a considerably lower melting point than the melting point of the material of the mount, then the glass frit may be sintered onto the mount without any problems.

The metallic mount is preferably composed of a material having a melting point below 600° C. The mount can be produced easily and is highly thermally conductive if it is composed of aluminum or of an aluminum alloy.

The mount may have cooling ribs in order to increase the heat dissipation to the environment.

The power components may be power semiconductor elements and/or driver components or driver electronics.

Furthermore, electrical and/or electronic components may also be arranged on the conductor track system, in order to complete the circuit.

The conductor track system, which is in the form of a thick film, allows the power components and/or electrical and/or electronic components to be conductively connected to the conductor track system by soldering and/or by bonding.

The electrically insulating polymer layer preferably has a thickness of above >20 µm. The polymer layer should be as homogeneous as possible, and should have no pores or air bubbles.

To arrange extensive electronics on a small area of the mount, a further insulating layer composed of a sintered polymer may be arranged on the conductor track system and on the electronic power components. In addition, a further conductor track system comprising a sintered glass frit with noble metal filling is arranged on the further insulating layer and further electronic power components are arranged on the further conductor track system.

Further layer systems, which comprise a polymer layer and a conductor track system, may also be applied in the same way.

The object of the present invention is also achieved by a method including applying an electrically insulating polymer layer to the mount, drying and sintering the mount in a temperature-controlled process, applying the conductor track system to the polymer layer as a paste system comprising a low melting-point glass frit with noble metal filling, drying and sintering the conductor track in a temperature-controlled process, and arranging conductively the electronic power components on the conductor track system.

The sintering process may be controlled such that the polymer layer is not burnt away, but such that the chemical/physical characteristics of the polymer base material are retained. Thus, the insulating characteristics of the polymer layer are retained and the conductivity of the conductor track system is also produced.

The polymer layer and conductor track system may be printed easily and at low cost, in particular by using the screen and printing method.

To reduce the number of operations, the temperature-controlled processes for sintering the polymer layer and for sintering the conductor track system may be carried out as a joint sintering process.

The drying process for the polymer layer and/or for the conductor track system is preferably carried out at a temperature of about 150° C.

In the process, the solvent can vaporize from the polymer layer and from the material of the conductor track system.

The temperature-controlled process for sintering the polymer layer is preferably carried out at a temperature of about 200° C., and lasts for about one hour.

To apply the layer system in a simple manner using the transfer process, a layer assembly comprising an electrically insulating polymer layer and a conductor track system which is arranged on the polymer layer and comprises a paste system composed of a low melting-point glass frit with no metal filling is applied to a flexible mount and dried, the layer assembly is applied together with the polymer layer on the mount such that it rests on the mount and the flexible mount is separated from the layer assembly, and the layer assembly is sintered onto the mount in a temperature-controlled process.

If the temperature process for sintering the polymer layer and/or for sintering the layer system or for sintering the layer assembly is carried out in a controlled manner at a temperature of between about 450° C. and 550° C., preferably at about 500° C., then the polymer layer and its insulating characteristics are retained, while the material of the conductor track system becomes electrically conductive.

The electronic power components and/or electrical and/or electronic components may be arranged conductively on the conductor track system in a simple manner by soldering and/or by bonding and/or by conductive adhesive bonding.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The single FIGURE of the drawing shows a cross-sectional view of an electronics unit according to the present invention.

DETAILED DESCRIPTION OF THE PRESENTLY PREFERRED EMBODIMENTS

The illustrated electronics unit has a mount 1 made of aluminum and provided with cooling ribs 2 on one of its faces. An electrically insulating polymer layer 3 with a thickness of 20 μm is printed by screen printing and is sintered on a surface of the mount 1 that is opposite to the cooling ribs 2. A conductor track system with three conductor tracks 4, 5 and 6 and composed of a glass frit with a silver filling is then printed as a paste system onto the polymer layer 3 and is subsequently sintered. A resistance layer 7 is printed onto the polymer layer 3 within one area of the conductor track 6.

A power semiconductor element 8 is arranged on the conductor track 5 and is connected to the conductor track 4 by a bonding wire 9. An electronic component 10, which is in the form of a surface mount device (SMD) component, is soldered by its first contact surface 11 to the conductor track 5, and is soldered by its second contact surface 12 to the conductor track 6.

In another embodiment, in order to arrange extensive electronics on a small area of the mount 1, an insulating layer 3a composed of a sintered polymer is arranged on the conductor track system 4 and on an electronic power component 8a. Additionally, a further conductor track system 4a that includes a sintered glass frit with noble metal filling is arranged on the insulating layer 3a, and an electronic power component 8b is arranged on the conductor track system 4a.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An electronics unit, comprising:
   a low multi-point metallic mount comprising a material having a melting point below 600 degrees Celsius;
   an insulating layer comprising a sintered electrically insulating polymer layer arranged on said mount;
   a conductor track system comprising a sintered glass frit with a noble metal filling arranged on said insulating layer, the sintered glass frit having a melting point that is lower than the melting point of the metallic mount, so that the glass frit is sinterable onto said mount;
   a resistance layer printed onto the polymer layer within one area of the conductor track system; and
   electronic power components arranged on said conductor track system.

2. The electronics unit of claim 1, wherein said noble metal filling comprises one of a silver filling and a filling containing silver.

3. The electronics unit of claim 1, wherein said glass frit is a low melting-point glass frit.

4. The electronics unit of claim 2, wherein said glass frit is a low melting-point glass frit.

5. The electronics unit of claim 1, wherein said mount is made of a material from the group consisting of aluminum and an aluminum alloy.

6. The electronics unit of claim 1, wherein said mount comprises cooling ribs.

7. The electronics unit of claim 1, wherein said power components comprise at least one of a power semiconductor element and a driver component.

8. The electronics unit of claim 1, further comprising at least one of an electrical and an electronic component arranged on the conductor track system.

9. The electronics unit of claim 8, wherein said power components and said at least one of an electrical and an electronic component are conductively connected to the conductor track system by one of soldering and bonding.

10. The electronics unit of claim 1, wherein said power components are conductively connected to the conductor track system by one of soldering and bonding.

11. The electronics unit of claim 1, wherein said electrically insulating polymer layer has a thickness of about >20 μm.

12. The electronics unit of claim 1, further comprising:
   a further insulating layer comprising a sintered polymer arranged on said conductor track system and on one of said electronic power components;
   a further conductor track system comprising a sintered glass frit with a noble metal filling arranged on said further insulating layer; and
   a further electronic power component arranged on said further conductor track system.

* * * * *